(12) United States Patent
Chen et al.

(10) Patent No.: US 10,043,718 B1
(45) Date of Patent: Aug. 7, 2018

(54) METHOD OF FABRICATING SEMICONDUCTOR DEVICE

(71) Applicant: UNITED MICROELECTRONICS CORP., Hsin-Chu (TW)

(72) Inventors: Kuan-Hung Chen, Taichung (TW); Rung-Yuan Lee, New Taipei (TW); Chun-Tsen Lu, Tainan (TW); Chorng-Lih Young, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/672,325

(22) Filed: Aug. 9, 2017

(30) Foreign Application Priority Data

Jul. 17, 2017 (CN) .......................... 2017 1 0579227

(51) Int. Cl.
| | | |
|---|---|---|
| *H01L 21/02* | (2006.01) | |
| *H01L 21/8238* | (2006.01) | |
| *H01L 21/20* | (2006.01) | |
| *H01L 21/225* | (2006.01) | |
| *H01L 29/16* | (2006.01) | |
| *H01L 21/8234* | (2006.01) | |
| *H01L 21/04* | (2006.01) | |
| *H01L 21/762* | (2006.01) | |
| *H01L 29/66* | (2006.01) | |
| *H01L 29/165* | (2006.01) | |
| *H01L 21/22* | (2006.01) | |
| *H01L 29/78* | (2006.01) | |

(52) U.S. Cl.
CPC ............... *H01L 21/823821* (2013.01); *H01L 21/02532* (2013.01); *H01L 21/0475* (2013.01); *H01L 21/2225* (2013.01); *H01L 21/2254* (2013.01); *H01L 21/76205* (2013.01); *H01L 21/823418* (2013.01); *H01L 21/823431* (2013.01); *H01L 21/823814* (2013.01); *H01L 29/165* (2013.01); *H01L 29/66636* (2013.01); *H01L 29/7848* (2013.01)

(58) Field of Classification Search
CPC ................................................. H01L 29/66636
See application file for complete search history.

(56) References Cited

U.S. PATENT DOCUMENTS

| | | | |
|---|---|---|---|
| 8,357,579 B2 * | 1/2013 | Wong | ................. H01L 29/1083 257/288 |
| 8,574,995 B2 | 11/2013 | Jeng | |
| 9,412,870 B2 * | 8/2016 | Wong | ................ H01L 29/66636 |
| 9,608,069 B1 * | 3/2017 | Basker | ................ H01L 29/1083 |
| 9,627,268 B2 | 4/2017 | Chang | |

(Continued)

*Primary Examiner* — Victor A Mandala
*Assistant Examiner* — Regan J Rundio
(74) *Attorney, Agent, or Firm* — Winston Hsu

(57) ABSTRACT

A method of fabricating a semiconductor device includes the following steps: providing a semiconductor substrate having a fin structure thereon; forming a recess in the fin structure so that the semiconductor substrate is partially exposed from the bottom surface of the recess; forming a dopant source layer conformally disposed on side surfaces and a bottom surface of the recess; removing the dopant source layer disposed on the bottom surface of the recess until portions of the semiconductor substrate are exposed from the bottom surface of the recess; and annealing the dopant source layer so as to form a side doped region in the fin structure.

15 Claims, 6 Drawing Sheets

(56) References Cited

U.S. PATENT DOCUMENTS

| | | | |
|---|---|---|---|
| 2006/0148220 A1* | 7/2006 | Lindert | H01L 21/26506 438/514 |
| 2013/0122676 A1* | 5/2013 | Jeng | H01L 21/823431 438/306 |
| 2017/0069725 A1 | 3/2017 | Bhimarasetti | |
| 2017/0133460 A1* | 5/2017 | Wu | H01L 21/30604 |

* cited by examiner

METHOD OF FABRICATING SEMICONDUCTOR DEVICE

BACKGROUND OF THE INVENTION

1. Field of the Invention

The present invention relates generally to a method of fabricating a semiconductor device. More particularly, the present invention relates to a method of fabricating a semiconductor device having multi-gate field-effect transistor structure.

2. Description of the Prior Art

Currently, a metal-oxide-semiconductor field-effect transistor (MOSFET) is the main component while constructing a very-large-scale integrated circuit. Over the past few decades, since the size of the MOSFET continues to shrink, the component speed, performance, circuit density and unit size prices have all improved significantly. For a typical planar transistor element, as the gate length continues to shrink, the source/drain on both sides thereof will have a bad effect on the carrier channel and may change the channel potential. In this situation, the gate will not be able to effectively control the on/off state of the carrier channel, which in turn affects the performance of the component. This phenomenon is also known as "short-channel effects" (SCE).

In order to suppress SCE, the industry has put forward a variety of corresponding solutions such as increasing doping concentration, reducing thickness of gate oxide, using ultra-shallow source/drain junctions, etc. However, for semiconductor elements which are reduced to 30 nm (nanometer, nm), the industry mainly uses field-effect transistors with a multi-gate structure (multi-gate) to solve SCE. In general, the multi-gate field-effect transistor includes a protruding fin structure in which a source/drain region and a channel region are provided. Also, a gate dielectric layer and a gate electrode can correspondingly cover the channel region of the fin structure. For the current multi-gate field-effect transistor, this solution can meet the needs of minimizing components, and has the ability to control the short channel effectively.

Yet, the current technology is still unable to effectively overcome the problem of uneven doping concentration of a three-dimensional structure. For example, even present technical solutions have utilized a multiple ion implantation process at various tilt angles to form a lightly doped drain (LDD) and or halo implant region, the doping uniformity still cannot meet the needs of high-end products. Therefore, there is still a need for a method of fabricating a semiconductor to produce a multi-gate field-effect transistor with a uniform lightly doped drain.

SUMMARY OF THE INVENTION

In view of the above, an object of the present invention is providing a method of manufacturing a semiconductor device to solve the drawbacks in the prior art.

According to an embodiment of the present invention, a method of fabricating a semiconductor device includes the following steps: providing a semiconductor substrate having a fin structure thereon; forming a recess in the fin structure so that the semiconductor substrate is partially exposed from the bottom surface of the recess; forming a dopant source layer conformally disposed on side surfaces and a bottom surface of the recess; removing the dopant source layer disposed on the bottom surface of the recess until portions of the semiconductor substrate are exposed from the bottom surface of the recess; and annealing the dopant source layer so as to form a side doped region in the fin structure.

According to another embodiment of the present invention, the method further includes forming a bottom doped region in the semiconductor substrate exposed from the bottom surface of the recess, wherein the bottom doped region has a first conductivity type and the side doped region has a second conductivity type, and the first conductivity type is different from the second conductivity type.

According to another embodiment of the present invention, the dopant source layer disposed on the bottom surface of the recess is removed before forming the bottom doped region.

According to another embodiment of the present invention, the method further includes forming a gate structure before forming the recess, wherein the gate structure covers a segment of the fin structure.

According to another embodiment of the present invention, the gate structure is covered by the dopant source layer.

According to another embodiment of the present invention, the method further includes removing the dopant source layer disposed on the side surfaces of the recess after annealing the dopant source layer.

According to another embodiment of the present invention, the method further includes forming an epitaxial structure disposed in the recess after removing the dopant source layer disposed on the side surfaces of the recess.

According to another embodiment of the present invention, the epitaxial structure has a second conductivity type.

According to another embodiment of the present invention, a composition of the dopant source layer is selected from borosilicate glass or phosphosilicate glass.

According to another embodiment of the present invention, a method of fabricating a semiconductor device includes the following steps: providing a semiconductor substrate having a first region and a second region; forming at least two fin structures respectively disposed in the first region and the second region; forming at least two gate structures respectively covering a segment of each of the fin structure disposed in the first region and the second region; forming a first recess in the fin structure disposed in the first region so that the semiconductor substrate is partially exposed from a bottom surface of the first recess; forming a first dopant source layer conformally disposed on side surfaces and the bottom surface of the first recess; removing the first dopant source layer disposed on the bottom surface of the first recess; forming a first doped region disposed in the semiconductor substrate exposed from the bottom of the first recess, wherein the first doped region has a first conductivity type; and annealing the first dopant source layer so as to form a second doped region disposed in the fin structures, wherein the second doped region has a second conductivity type, and the first conductivity type is different from the second conductivity type.

According to another embodiment of the present invention, the method further includes forming a first epitaxial structure disposed in the first recess after removing the first dopant source layer disposed on the side surfaces of the first recess.

According to another embodiment of the present invention, the first epitaxial structure has the second conductivity type.

According to another embodiment of the present invention, wherein after forming the first epitaxial structure, the method further includes: forming a mask covering the first epitaxial structure disposed in the first recess; forming a second recess disposed in the second region under the cover of the mask so that the semiconductor substrate is partially exposed from a bottom surface of the second recess; forming a second dopant source layer conformally disposed on a top surface of the mask, side surfaces and the bottom surface of the second recess; removing the second dopant source layer disposed on the bottom surface of the second recess;

forming a third doped region disposed in the semiconductor substrate exposed from the bottom of the second recess, wherein the third doped region has the second conductivity type; and annealing the dopant source layer so as to form a fourth doped region disposed in the fin structures, wherein the fourth doped region has the first conductivity type.

According to another embodiment of the present invention, the second dopant source layer disposed on the bottom surface of the second recess is removed before forming the third doped region.

According to another embodiment of the present invention, the second dopant source layer disposed on the top surface of the mask is removed during the step of removing the second dopant source layer disposed on the bottom surface of the second recess.

According to another embodiment of the present invention, the method further includes forming a second epitaxial structure disposed in the second recess after removing the second dopant source layer disposed on the side surfaces of the second recess.

According to another embodiment of the present invention, the second epitaxial structure has the first conductivity type.

According to the above-mentioned embodiments, a doped region, for example, a lightly doped drain, is uniformly distributed in the fin structure around the recess by forming a dopant source layer conformally disposed in the recess and annealing the dopant source layer.

Compared to the prior art which uses an ion implantation process to form a lightly doped drain, a semiconductor device formed by the method above can effectively avoid the occurrence of a short-channel effects. In addition, according to the above-mentioned embodiments, because the first doped region and the third doped region are formed in the semiconductor substrate exposed from the bottom of the recess after removing the dopant source layer on the bottom surface of the recess, the dopant concentration of the first doped region and the third doped region are more uniform, thereby preventing current from entering or leaving the fin structure through the bottom surface of the recess.

These and other objectives of the present invention will no doubt become obvious to those of ordinary skill in the art after reading the following detailed description of the preferred embodiment that is illustrated in the various figures and drawings.

DETAILED DESCRIPTION

In the following paragraphs, the embodiments of the semiconductor device and the manufacturing method thereof are described in order to enable those skilled in the art to practice the present invention. The specific embodiments may refer to the corresponding drawings so that the drawings form parts of the embodiments. The following embodiments are not to be taken in a limiting sense, and other embodiments may be modified by those skilled in the art without departing from the spirit and scope of the invention.

Figure 1:
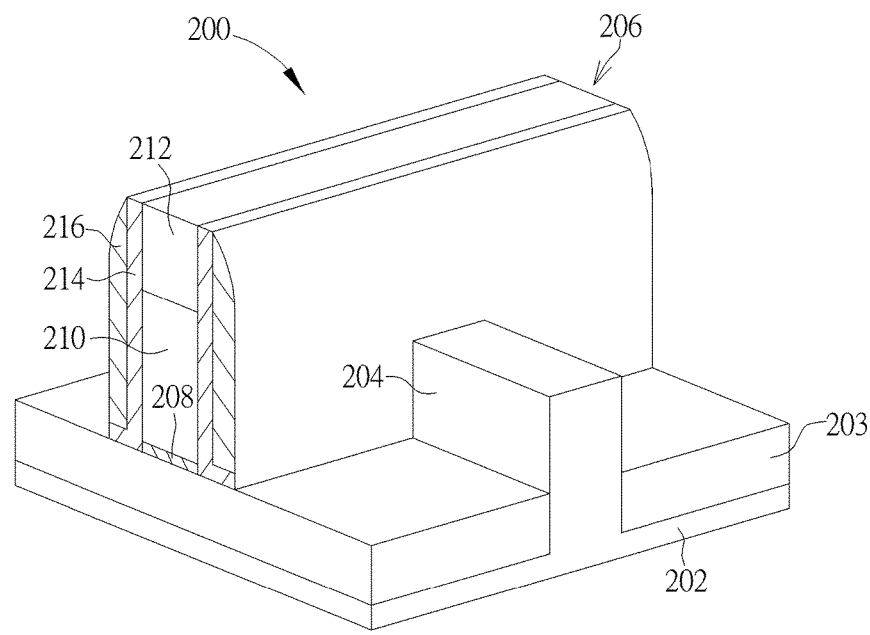
FIG. 1 is a schematic, perspective view of an initial stage of a semiconductor device according to an embodiment of the present invention.

FIG. 1 is a schematic, perspective view of an initial stage of a semiconductor device according to an embodiment of the present invention. As shown in FIG. 1, a semiconductor device 200 includes a semiconductor substrate 202, where shallow trench isolation (STI) structure 203, at least one fin structure 204, and at least one gate structure 206 are provided on the semiconductor substrate 202. There are at least two direct contact surfaces (including at least two contact side surfaces) between the fin structure 204 and the gate structure 206. Therefore, the field-effect transistor having multiple direct contact surfaces may be referred to a double-gate MOSFET or a tri-gate MOSFET.

It should be noted that although a single gate structure 206 and a single fin structure 204 are depicted in FIG. 1, the number thereof may be varied depending on the product requirements. For example, one or more parallel gate structures 206 may be provided on the semiconductor substrate 202 such that the same fin structure 204 may be covered by more than one gate structure 206. In addition, the same gate structure 206 is preferably used as a gate of the transistor with same conductive type, for example, as a gate of a PMOS transistor or a gate of a NMOS transistor.

The above-mentioned semiconductor substrate 202 may be, for example, a silicon substrate, a silicon-contained substrate, a semiconductor silicon-coated substrate (e.g. GaAs-on-silicon), or a graphene-on-silicon substrate, but is not limited thereto.

The shallow trench insulation structure 203 is provided around the fin structure 204. The gate structure 206 is disposed on the shallow trench insulation structure 203 and covers a segment of the fin structure 204. It should be noted that the fin structure 204 herein is defined as a segment protruding from a top surface of the shallow trench insulation structure 203. Thus, the interface between the fin structure 204 and the semiconductor substrate 202 may be considered to be aligned with the top surface of the shallow trench insulation structure 203.

The gate structure 206 includes a gate dielectric layer 208, a dummy electrode 210, and a cap layer 212 from bottom to top. Furthermore, the sidewalls of the gate structure 206 may be covered by at least one spacer. For example, the sidewalls of the gate structure 206 may be sequentially covered by the first spacer 214 and the second spacer 216.

It is to be noted that the gate structure 206 may be considered as a dummy gate structure. In other words, the gate dielectric layer 208 will be replaced with a high dielectric constant gate dielectric layer in the subsequent process, and the dummy electrode 210 will be replaced with a conductive metal layer. In this embodiment, the gate dielectric layer may be a sacrificial material, such as an oxide layer, which is generally convenient for removal in the subsequent processes. The composition of the dummy electrode 210 may be a polycrystalline semiconductor material, such as polysilicon, but is not limited thereto. The cap layer 212 may include a single or multi-layer structure consisting of a nitride layer or an oxide layer, and be used as a patterned hard mask.

Figure 2:
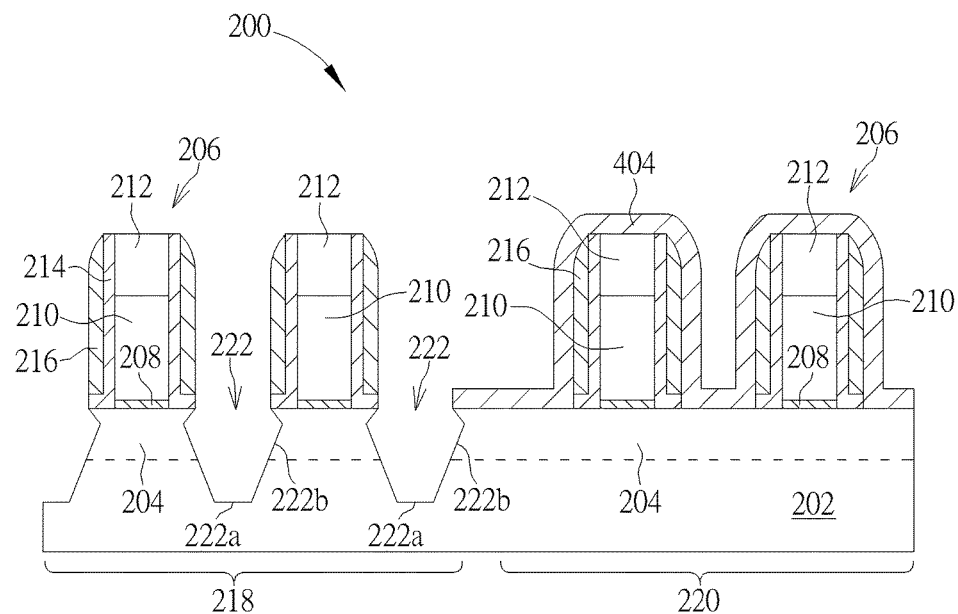
FIG. 2 is a schematic, cross-sectional diagram of the semiconductor device when a recess is formed in a fin structure according to an embodiment of the present invention.

FIG. 2 is a schematic, cross-sectional diagram of the semiconductor device when a recess is formed in a fin structure according to an embodiment of the present invention. It should be noted that the structure shown in FIG. 2 is a cross-sectional diagram of the semiconductor device 200 taken along a long axis of the fin structure shown in FIG. 1. However, the semiconductor device 200 shown in FIG. 2 has a first region 218 and a second region 220. The gate structures 206 and the fin structures 204 are disposed in the first region 218 and the second region 220, respectively. The first region 218 and the second region 220 may be used to accommodate the P-type transistor and the N-type transistor, respectively, and thus may be referred to a PMOS region and a NMOS region, respectively.

Still refer to FIG. 2, a patterned etch mask 404 is formed to cover the gate structure 206 and the fin structure 204 in the second region. The position of the subsequently formed recesses can be defined by the patterned etch mask 404. The material of the patterned etch mask 404 may be selected from silicon nitride or silicon carbide, but is not limited thereto.

Next, an etching process, preferably a anisotropic dry etching process, is applied to the semiconductor device 200 under the cover of the patterned etch mask 404 so as to remove the fin structures 204 and portions of the semiconductor substrate 202 exposed from the spacer 216 and the patterned etch mask 404. After this etching process, first recesses 222 are formed in the fin structure 204 of the first region 218, and the first recesses 222 are located on both sides of the gate structure 206. Each of the first recesses 222 has a bottom surface 222a and side surfaces 222b, where a depth of the bottom surface 222a is preferably deeper than the top surface of the shallow trench structure 203. In this way, the semiconductor substrate 202 below the bottom surface 222a is exposed. The etching process may be a plasma etching process, where the component of etching gas may contain hydrogen bromide/oxygen, sulfur hexafluoride/chlorine gas, but is not limited thereto.

Figure 3:
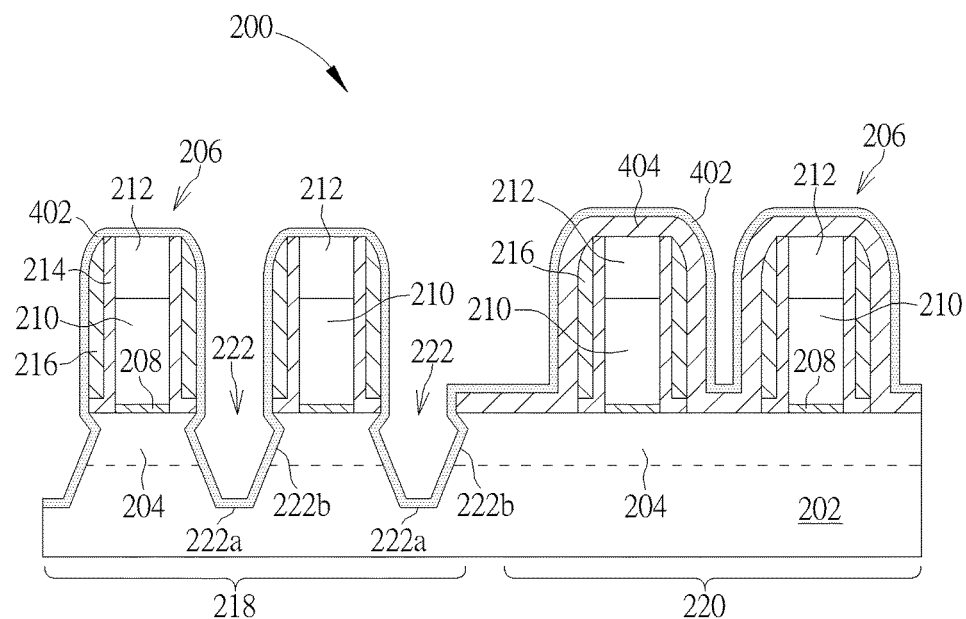
FIG. 3 is a schematic, cross-sectional diagram of the semiconductor device when a dopant source layer is conformally formed on the side surfaces and the bottom surface of the recess according to an embodiment of the present invention.

FIG. 3 is a schematic, cross-sectional diagram of the semiconductor device after a dopant source layer is conformally formed on the side surfaces and the bottom surface of the recess according to an embodiment of the present invention. After forming the first recesses 222, as shown in FIG. 3, a dopant source layer 402 may be conformally formed on the side surfaces 222b and the bottom surface 222a of the first recesses 222. In the case for the first region 218 is a PMOS region, the material of the dopant source layer 402 preferably includes a P-type dopant-contained film such as borosilicate glass (BSG). Moreover, the dopant source layer 402 is conformally covered the patterned etch mask 404 of the second region 220.

Figure 4:
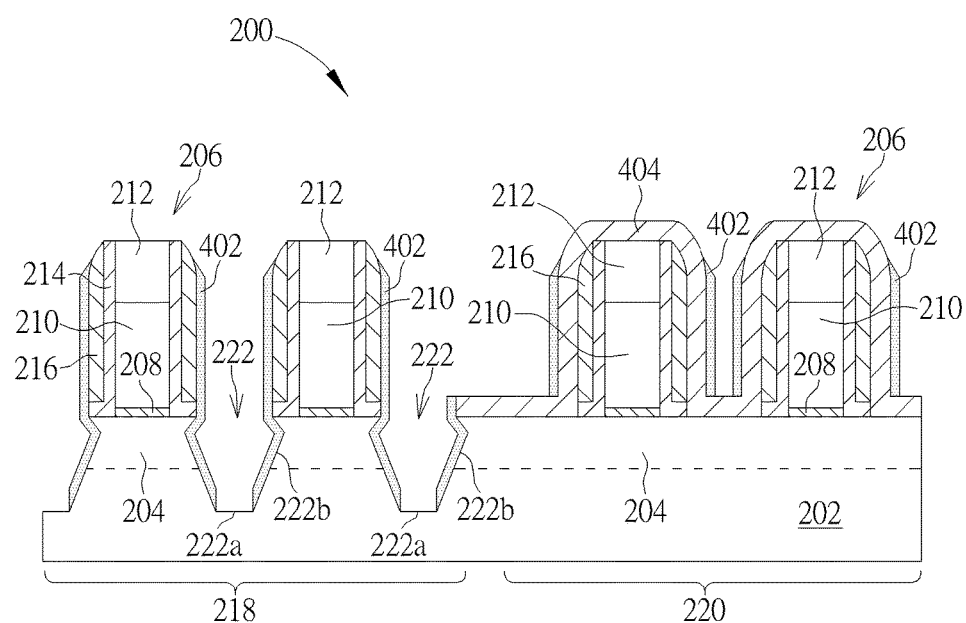
FIG. 4 is a schematic, cross-sectional diagram of the semiconductor device when the dopant source layer disposed on the bottom surface of the recess is removed according to an embodiment of the present invention.

FIG. 4 is a schematic, cross-sectional diagram of the semiconductor device when the dopant source layer disposed on the bottom surface of the recess is removed according to an embodiment of the present invention. As shown in FIG. 4, the dopant source layer 402 disposed on the bottom surface 222a of the first recess 222 is removed by using a anisotropic etching process to expose the semiconductor substrate 202 from the bottom surface 222a of the first recess 222. It should be noted that some of the dopant source layer 402 disposed above the gate structure 206 and the patterned etch mask 404 is also be removed during this etching process. Even so, the side surfaces 222b of the first recess 222 are completely covered by the dopant source layer 402.

Figure 5:
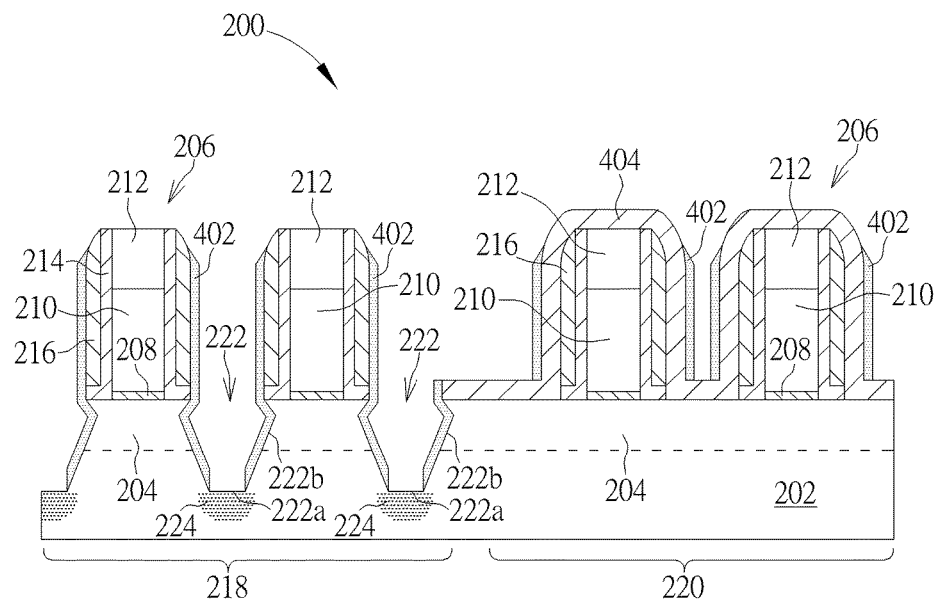
FIG. 5 is a schematic, cross-sectional diagram of the semiconductor device when doped regions are formed in the semiconductor substrate exposed from the bottom surface of the recess according to an embodiment of the present invention.

FIG. 5 is a schematic, cross-sectional diagram of the semiconductor device when doped regions are formed in the semiconductor substrate exposed from the bottom surface of the recess according to an embodiment of the present invention. As shown in FIG. 5, a doping process, such as an anisotropic ion implantation process or a plasma doping process, is performed to form a punch-through stopper region, also called a bottom doped region or a first doped region 224, in the semiconductor substrate 202 exposed from the bottom surface 222a of the recess. The punch-through stopper region has a first conductivity type. In the case where the first region 218 is a PMOS region, the first conductivity type is N-type. It should be noted that since the bottom surface 222a of the recess is not covered by the dopant source layer 402 during the doping process, the dopant may be uniformly distributed in the semiconductor substrate 202 exposed from the bottom surface 222a of the recess. In other words, a first doped region 224 (or a punch-through stopper region) having a uniform concentration can more effectively prevent current from entering or leaving through the bottom surface 222a of the recess.

Figure 6:
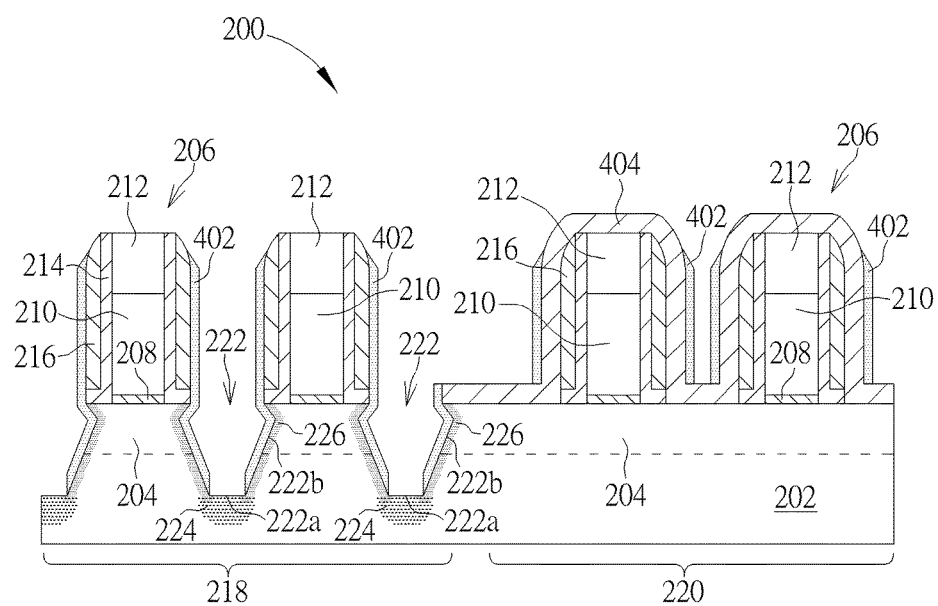
FIG. 6 is a schematic, cross-sectional diagram of the semiconductor device after annealing the dopant source layer according to an embodiment of the present invention.

FIG. 6 is a schematic, cross-sectional diagram of the semiconductor device after annealing the dopant source layer according to an embodiment of the present invention. As shown in FIG. 6, a heat treatment, such as an annealing process, is performed to let the dopant in the dopant source layer 402 diffuse into the adjacent fin structure 204 and the semiconductor substrate 202 and thereby forming a lightly doped drain (LDD), also called a side doped region or a second doped region 226. The lightly doped drain has a second conductivity type. In the case where the first region 218 is a PMOS region, the second conductivity type is P-type.

It should be noted that since the dopant source layer 402 completely and tightly covers the side surfaces 222b of the first recess 222, the dopant therein can be uniformly diffused into the adjacent fin structure 204 and the semiconductor substrate 202. In other words, by using this diffusion process, the shadow effect resulted from the ion implantation process using in the prior art can be avoided.

In addition, since the bottom surface 222a of the recess is not covered by the dopant source layer 402 during the annealing process, the second doped region 226 (or the side doped region) is not formed in the semiconductor substrate 202 exposed from the bottom surface 222a of recess. In other words, even when the annealing process is performed, the dopant having the first conductivity type in the first doped region 224 (also called the bottom doped region or the punch-through stopper region) is not neutralized with the dopant having the second conductivity type in the dopant source layer 402. Therefore, the first doped region 224 can retain excellent resistance to current penetration.

After the annealing process is performed, the dopant source layer 402 is completely removed by an etching process, such as an acid-based wet etching process.

Figure 7:
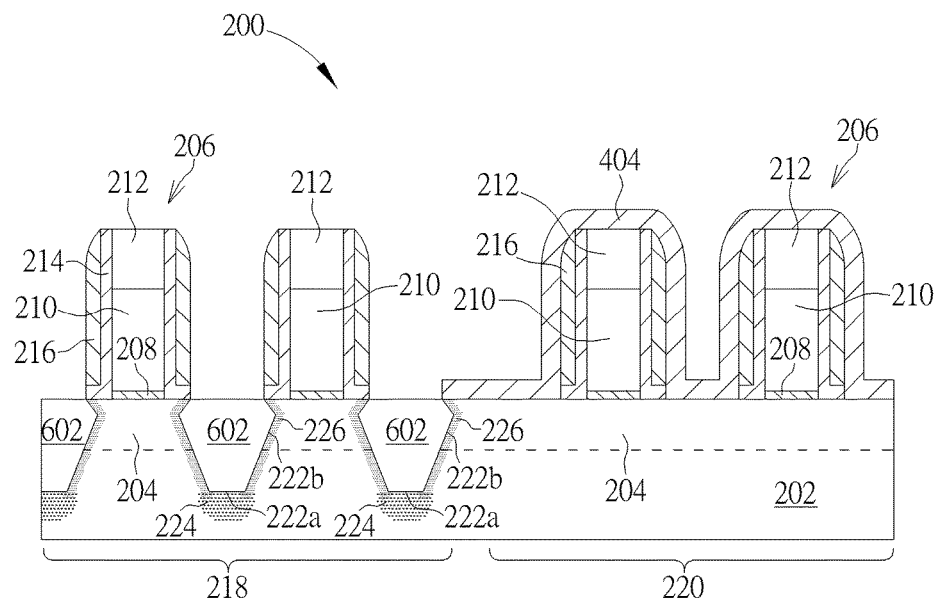
FIG. 7 is a schematic, cross-sectional diagram of the semiconductor device when an epitaxial structure is formed in the recess according to an embodiment of the present invention.

FIG. 7 is a schematic, cross-sectional diagram of the semiconductor device when an epitaxial structure is formed in the recess according to an embodiment of the present invention. As shown in FIG. 7, first epitaxial structures 602 are formed on each side of the gate structure 206, which has the second conductivity type and serves as a main body region of the source/drain of the subsequently formed transistor element. It should be noted that the epitaxial growth process is preferably an in-situ growth process according to this embodiment. For example, for the process of forming a PMOS element, the epitaxial growth process may be performed through forming silicon-germanium monocrystalline and doping a dopant with a particular conductive type, such as boron, simultaneously. In this way, the first epitaxial structure 602 is achieved the required electricality, thereby directly constructing the source/drain of the PMOS element.

Figure 8:
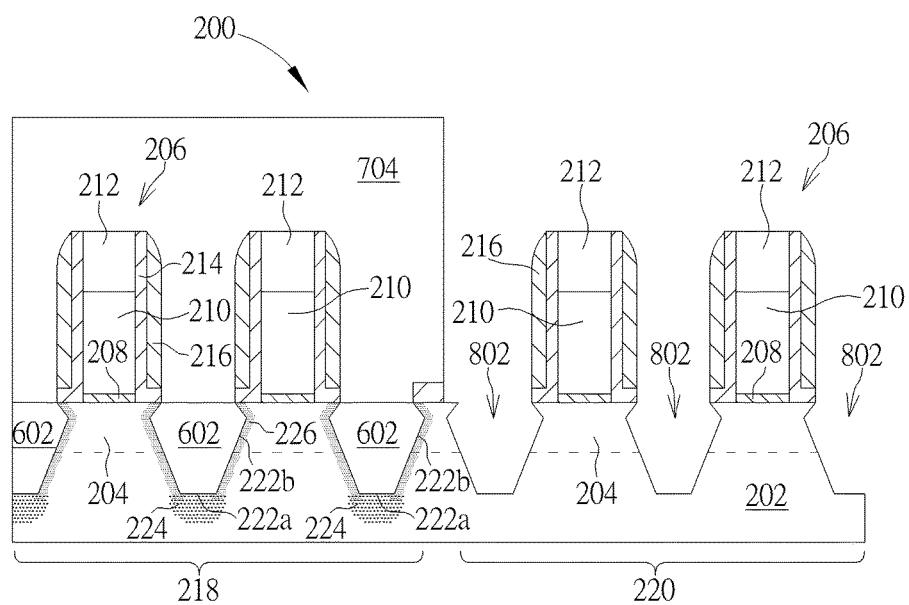
FIG. 8 is a schematic, cross-sectional diagram of the semiconductor device when a recess is formed in the fin structure according to an embodiment of the present invention.

FIG. 8 is a schematic, cross-sectional diagram of the semiconductor device when a recess is formed in the fin structure according to an embodiment of the present invention. As shown in FIG. 8, a patterned mask 704 is formed to cover the gate structure 206, the fin structure 204, and the first epitaxial structure 602 within the first region 218. By providing the patterned mask 704, it is possible to define the position of the subsequently formed recesses. The material of the patterned mask 704 may be selected from single or multi-layer photoresists, but is not limited thereto.

Next, as shown in FIG. 8, an etching process, preferably an anisotropic dry etching process, is applied to the semiconductor device 200 under the cover of the patterned etch mask 704 to remove the fin structures 204 and portions of the semiconductor substrate 202 exposed from the spacer 216 and the patterned etch mask 704. After this etching process, second recesses 802 are formed in the fin structure 204 of the second region 220, and the second recesses 802 are located on both sides of the gate structure 206. Each of the second recesses 802 has a bottom surface 802a and side surfaces 802b, wherein a depth of the bottom surface 802a is preferably deeper than the top surface of the shallow trench structure 203 so that the semiconductor substrate 202 below the bottom surface 802a is exposed. The etching process may be a plasma etching process, where the component of etching gas may contain hydrogen bromide/oxygen, sulfur hexafluoride/chlorine gas, but is not limited thereto.

Figure 9:
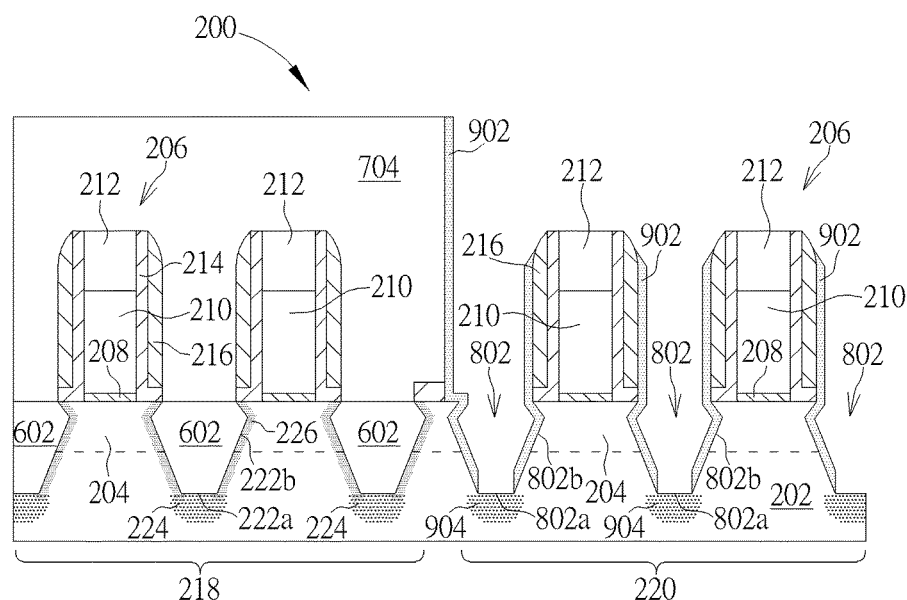
FIG. 9 is a schematic, cross-sectional diagram of the semiconductor device when doped regions are formed in the semiconductor substrate exposed from the bottom surface of the recess according to an embodiment of the present invention.

FIG. 9 is a schematic, cross-sectional diagram of the semiconductor device when doped regions are formed in the semiconductor substrate exposed from the bottom surface of the recess according to an embodiment of the present invention. After forming the second recesses 802, as shown in FIG. 9, a dopant source layer 902 may be conformally formed on the side surfaces 802b and the bottom surface 802a of the second recesses 802. In the case where the second region 220 is a NMOS region, the material of the dopant source layer 902 preferably includes an N-type dopant-contained film, such as phosphosilicate glass (PSG). Moreover, the dopant source layer 902 is conformally covered the patterned etch mask 704 of the first region 218.

As shown in FIG. 9, the dopant source layer 902 disposed on the bottom surface 802a of the second recess 802 is removed by using an anisotropic etching process to expose the semiconductor substrate 202 from the bottom surface 802a of the second recess 802. It should be noted that some of the dopant source layer 902 disposed above the gate structure 206 and the patterned etch mask 704 is also be removed during this etching process. Even so, the side surfaces 802b of the second recess 802 are completely covered by the dopant source layer 902.

As shown in FIG. 9, a doping process, such as an anisotropic ion implantation process or a plasma doping process, is performed to form a punch-through stopper region, also called a bottom doped region, or a third doped region 904 in the semiconductor substrate 202 exposed from the bottom surface 802a of the recess 802. The punch-through stopper region (or the third doped region 904) has a second conductivity type. In the case where the second region 280 is an NMOS region, the second conductivity type is P-type. It should be noted that since the bottom surface 802a of the recess 802 is not covered by the dopant source layer 902 during the doping process, the dopant may be uniformly distributed in the semiconductor substrate 202 exposed from the bottom surface 802a of the recess 802. In other words, the concentration of the third doped region 904 (or a punch-through stopper region) may be more uniform which may effectively prevent current from entering or leaving through the bottom surface 802a of the recess 802.

Next, a heat treatment, such as an annealing process, is performed such that the dopant in the dopant source layer 902 diffuses into the adjacent fin structure 204 and the semiconductor substrate 202 so as to form a lightly doped drain (LDD), also called a side doped region or a fourth doped region 906. The lightly doped drain (or the fourth doped region 906) has a first conductivity type. In the case where the second region 220 is an NMOS region, the first conductivity type is N-type.

Since the dopant source layer 902 completely and tightly covers the side surfaces 802b of the second recess 802, the dopant therein can be uniformly diffused into the adjacent fin structure 204 and the semiconductor substrate 202 during the annealing process. In other words, by using this diffusion process, the shadow effect resulted from the ion implantation process of the prior art can be avoided.

In addition, since the bottom surface 802a of the recess 802 is not covered by the dopant source layer 902 during the annealing process, the fourth doped region 906 (or the side doped region) is not formed in the semiconductor substrate 202 exposed from the bottom surface 802a of recess 802. In other words, even when the annealing process is performed, the dopant having the second conductivity type in the third doped region 904 (or the bottom doped region or the punch-through stopper region) is not neutralized with the dopant having the first conductivity type in the dopant source layer 902. Therefore, the third doped region 904 can retain excellent resistance to current penetration.

After the annealing process, the dopant source layer 902 is then completely removed by an etching process, such as an acid-based wet etching process.

Figure 10:
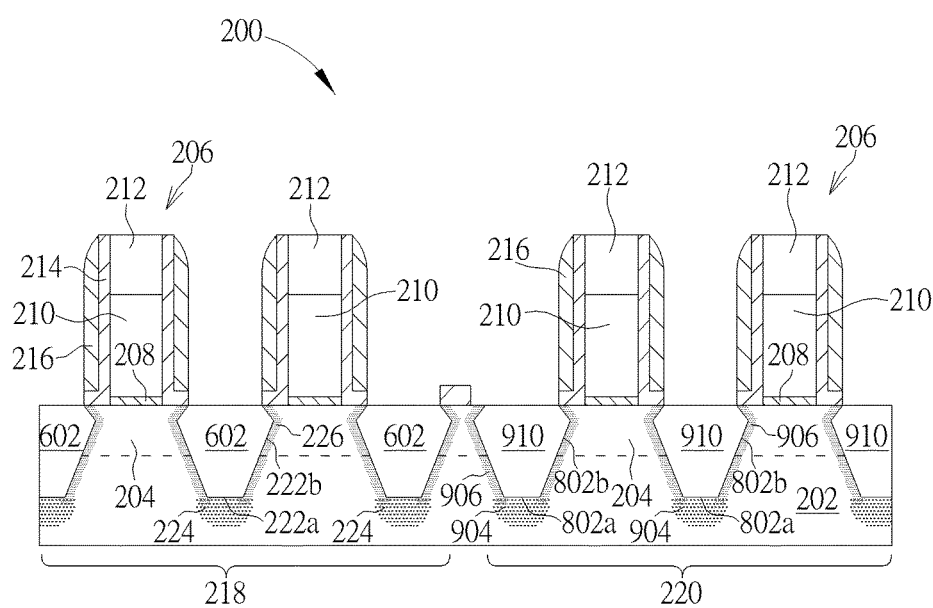
FIG. 10 is a schematic, cross-sectional diagram of the semiconductor device when an epitaxial structure is formed in the recess according to an embodiment of the present invention.

FIG. 10 is a schematic, cross-sectional diagram of the semiconductor device when an epitaxial structure is formed in the recess according to an embodiment of the present invention. After completion of the process shown in FIG. 9, as shown in FIG. 10, the fourth doped region 906 is formed uniformly to be distributed in the fin structure and the semiconductor substrate 202 around the second recess 802. The fourth doped region 906 is not formed in the semiconductor substrate 202 at the bottom surface 802a of the recess 802. Next, as shown in FIG. 10, second epitaxial structures 910 are respectively formed on each side of the gate structure 206. Each second epitaxial structure 910 has the first conductivity type and serves as a main body region of the source/drain of the subsequently formed transistor element. It should be noted that the epitaxial growth process is preferably an in-situ growth process according to this embodiment. For example, for the process of forming an NMOS element, the epitaxial growth process may be performed through forming silicon phosphorus monocrystalline and doping a dopant with a particular conductive type, such as phosphorus, simultaneously, such that the first epitaxial structure 910 is achieved the required electricality, thereby directly constructing the source/drain of the NMOS element.

Figure 11:
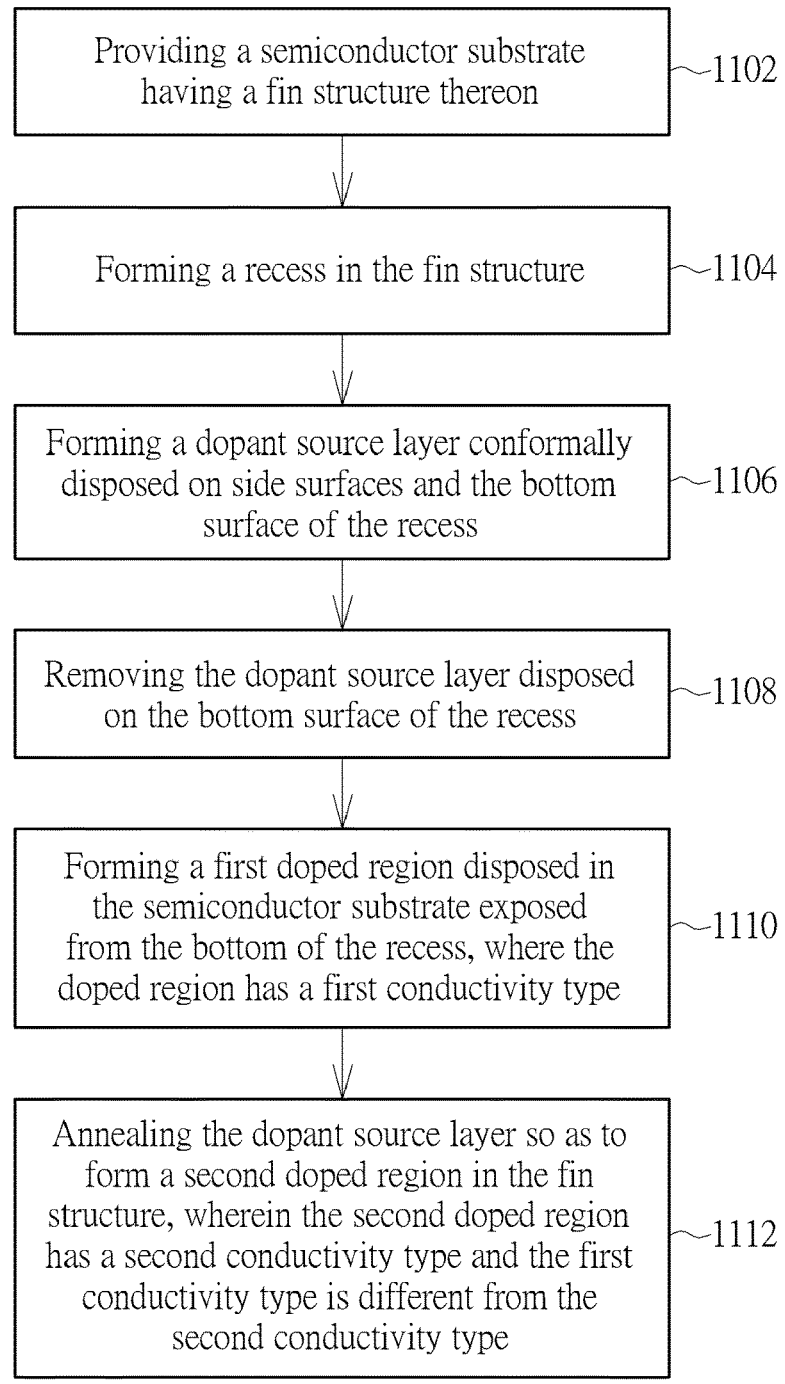
FIG. 11 is a flow chart showing the fabrication of a semiconductor device according to an embodiment of the present invention.

FIG. 11 is a flow chart showing the fabrication of a semiconductor device according to an embodiment of the present invention. The method includes at least the following steps:

Step 1102: providing a semiconductor substrate having a fin structure thereon;

Step 1104: forming a recess in the fin structure;

Step 1106: forming a dopant source layer conformally disposed on side surfaces and the bottom surface of the recess;

Step 1108: removing the dopant source layer disposed on the bottom surface of the recess;

Step 1110: forming a first doped region disposed in the semiconductor substrate exposed from the bottom of the recess, where the doped region has a first conductivity type;

Step 1112: annealing the dopant source layer so as to form a second doped region in the fin structure, wherein the second doped region has a second conductivity type and the first conductivity type is different from the second conductivity type.

Furthermore, according to other embodiments of the present invention, the above-mentioned second doped region 226 and the fourth doped region 906 may be formed by a plasma doping process, so that the deposition of the dopant source layers 402 and 902 and the annealing process may be omitted.

According to the above-mentioned embodiments, a doped region, for example, a lightly doped drain, is uniformly formed and distributed in the fin structure around the recess by forming a dopant source layer conformally disposed in the recess and then annealing the dopant source layer.

Compared to the prior art which uses anion implantation process to form a lightly doped drain, a semiconductor device formed by the method above can effectively avoid the occurrence of a short-channel effects. In addition, according to the above-mentioned embodiments, because the first doped region and the third doped region are formed in the semiconductor substrate exposed from the bottom surface of the recess after removing the dopant source layer from the bottom surface of the recess, the dopant concentration of the first doped region and the third doped region are more uniform, thereby preventing current from entering or leaving to the fin structure through the bottom surface of the recess.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
    providing a semiconductor substrate having a fin structure thereon;
    forming a recess in the fin structure so that the semiconductor substrate is partially exposed from a bottom surface of the recess;
    forming a dopant source layer conformally disposed on side surfaces and the bottom surface of the recess;
    removing the dopant source layer disposed on the bottom surface of the recess so that portions of the semiconductor substrate are exposed from the bottom surface of the recess;
    after removing the dopant source layer disposed on the bottom surface of the recess, forming a bottom doped region in the semiconductor substrate exposed from the bottom surface of the recess, wherein the bottom doped region has a first conductivity type and the side doped region has a second conductivity type, and the first conductivity type is different from the second conductivity type; and
    annealing the dopant source layer so as to form a side doped region in the fin structure.

2. The method of fabricating a semiconductor device of claim 1, further comprising forming a gate structure before forming the recess, wherein the gate structure covers a segment of the fin structure.

3. The method of fabricating a semiconductor device of claim 2, wherein the gate structure is covered by the dopant source layer.

4. The method of fabricating a semiconductor device of claim 1, further comprising removing the dopant source layer disposed on the side surfaces of the recess after annealing the dopant source layer.

5. The method of fabricating a semiconductor device of claim 4, further comprising forming an epitaxial structure disposed in the recess after removing the dopant source layer disposed on the side surfaces of the recess.

6. The method of fabricating a semiconductor device of claim 5, further comprising forming a bottom doped region in the semiconductor substrate exposed from the bottom surface of the recess, wherein the bottom doped region has a first conductivity type and the epitaxial structure has a second conductivity type, and the first conductivity type is different from the second conductivity type.

7. The method of fabricating a semiconductor device of claim 1, wherein a composition of the dopant source layer is selected from borosilicate glass or phosphosilicate glass.

8. A method of fabricating a semiconductor device, comprising:
    providing a semiconductor substrate having a first region and a second region;

forming at least two fin structures respectively disposed in the first region and the second region;

forming at least two gate structures respectively covering a segment of each of the fin structure disposed in the first region and the second region;

forming a first recess in the fin structure disposed in the first region so that the semiconductor substrate is partially exposed from a bottom surface of the first recess;

forming a first dopant source layer conformally disposed on side surfaces and the bottom surface of the first recess;

removing the first dopant source layer disposed on the bottom surface of the first recess;

after removing the first dopant source layer disposed on the bottom surface of the first recess, forming a first doped region disposed in the semiconductor substrate exposed from the bottom of the first recess, wherein the first doped region has a first conductivity type; and annealing the first dopant source layer so as to form a second doped region disposed in the fin structures, wherein the second doped region has a second conductivity type, and the first conductivity type is different from the second conductivity type.

9. The method of fabricating a semiconductor device of claim 8, further comprising forming a first epitaxial structure disposed in the first recess after removing the first dopant source layer disposed on the side surfaces of the first recess.

10. The method of fabricating a semiconductor device of claim 9, wherein the first epitaxial structure has the second conductivity type.

11. The method of fabricating a semiconductor device of claim 9, wherein after forming the first epitaxial structure, the method further comprises:

forming a mask covering the first epitaxial structure disposed in the first recess;

forming at least one second recess disposed in the second region under the cover of the mask so that the semiconductor substrate is partially exposed from a bottom surface of the second recess;

forming a second dopant source layer conformally disposed on a top surface of the mask, side surfaces and the bottom surface of the second recess;

removing the second dopant source layer disposed on the bottom surface of the second recess;

forming a third doped region disposed in the semiconductor substrate exposed from the bottom of the second recess, wherein the third doped region has the second conductivity type; and annealing the second dopant source layer so as to form a fourth doped region disposed in the fin structures, wherein the fourth doped region has the first conductivity type.

12. The method of fabricating a semiconductor device of claim 11, wherein the second dopant source layer disposed on the bottom surface of the second recess is removed before forming the third doped region.

13. The method of fabricating a semiconductor device of claim 11, wherein the second dopant source layer disposed on the top surface of the mask is removed during the step of removing the second dopant source layer disposed on the bottom surface of the second recess.

14. The method of fabricating a semiconductor device of claim 11, further comprising forming a second epitaxial structure disposed in the second recess after removing the second dopant source layer disposed on the side surfaces of the second recess.

15. The method of fabricating a semiconductor device of claim 14, wherein the second epitaxial structure has the first conductivity type.

* * * * *